United States Patent
Tabuchi

(10) Patent No.: US 9,664,460 B2
(45) Date of Patent: May 30, 2017

(54) METHOD OF SUPPLYING TEMPERATURE CONTROL FLUID TO TEMPERATURE CONTROL SYSTEM AND STORAGE MEDIUM

(71) Applicant: Tokyo Electron Limited, Tokyo (JP)

(72) Inventor: Atsuhiko Tabuchi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 345 days.

(21) Appl. No.: 14/409,794

(22) PCT Filed: Jul. 18, 2013

(86) PCT No.: PCT/JP2013/070123
§ 371 (c)(1),
(2) Date: Dec. 19, 2014

(87) PCT Pub. No.: WO2014/014127
PCT Pub. Date: Jan. 23, 2014

(65) Prior Publication Data
US 2015/0176928 A1    Jun. 25, 2015

Related U.S. Application Data

(60) Provisional application No. 61/677,034, filed on Jul. 30, 2012.

(30) Foreign Application Priority Data

Jul. 20, 2012    (JP) .................................. 2012-161526

(51) Int. Cl.
*F28F 13/06*    (2006.01)
*G05D 23/13*    (2006.01)
(Continued)

(52) U.S. Cl.
CPC .............. *F28F 13/06* (2013.01); *G05D 9/00* (2013.01); *G05D 23/1393* (2013.01);
(Continued)

(58) Field of Classification Search
CPC ......... H01L 21/67098; H01L 21/67109; H01L 21/67248; C23C 16/46; C23C 16/463
(Continued)

(56) References Cited

U.S. PATENT DOCUMENTS

2005/0045104 A1*  3/2005  Arai .................. H01J 37/32082
                                                            118/724
2008/0223555 A1*  9/2008  Di Stefano ............. F25B 49/02
                                                            165/101
(Continued)

FOREIGN PATENT DOCUMENTS

JP    2009-015594 A    1/2009
JP    2010-117812 A    5/2010
JP    2011-094927 A    5/2011

OTHER PUBLICATIONS

International Search Report for PCT/JP2013/070123 dated Aug. 20, 2013.

*Primary Examiner* — Justin Jonaitis
*Assistant Examiner* — Eric Ruppert
(74) *Attorney, Agent, or Firm* — Pearne & Gordon LLP

(57) ABSTRACT

A temperature control system 1 includes a joint path 71 that supplies a fluid from a low-temperature path 76 having a variable valve 79a and a high-temperature path 77 having a variable valve 79c to a temperature regulation member 70; a bypass path 73 that has a variable valve 79b and circulates the fluid flowing a collection path 72 that collects the supplied fluid through the temperature regulation member; a circulation pump 87 at the collection path; and a tank 78 that is provided at an upstream side of the circulation pump and supplies the fluid to the circulation pump when an amount of
(Continued)

the fluid reaches a preset amount. The variable valves 79a and 79b are opened to supply the fluid, and the valves 79b and 79c are opened to supply the fluid after detecting that the amount of the fluid in the tank 78 reaches the preset amount.

8 Claims, 4 Drawing Sheets

(51) Int. Cl.
 *G05D 9/00* (2006.01)
 *G05D 23/185* (2006.01)
 *G05D 23/19* (2006.01)
 *H01L 21/67* (2006.01)
 *F28F 27/00* (2006.01)

(52) U.S. Cl.
 CPC ..... *G05D 23/1858* (2013.01); *G05D 23/1951* (2013.01); *F28F 27/00* (2013.01); *H01L 21/67098* (2013.01); *H01L 21/67109* (2013.01); *H01L 21/67248* (2013.01); *Y10T 137/0329* (2015.04); *Y10T 137/86389* (2015.04)

(58) Field of Classification Search
 USPC .............. 165/101, 103, 201; 118/724, 725; 156/345.27, 345.37, 345.52, 345.53
 See application file for complete search history.

(56) References Cited

U.S. PATENT DOCUMENTS

2008/0314564 A1* 12/2008 Nagaseki ............... G05D 23/19
 165/104.31
2010/0116484 A1* 5/2010 Kokubo .................. F25D 17/02
 165/201

* cited by examiner

METHOD OF SUPPLYING TEMPERATURE CONTROL FLUID TO TEMPERATURE CONTROL SYSTEM AND STORAGE MEDIUM

CROSS-REFERENCE TO RELATED APPLICATION

This Application is a U.S. national phase application under 35 U.S.C. §371 of PCT Application No. PCT/JP2013/070123 filed on Jul. 18, 2013, which claims the benefit of Japanese Patent Application No. 2012-161526 filed on Jul. 20, 2012, and U.S. Provisional Application Ser. No. 61/677,034 filed on Jul. 30, 2012, the entire disclosures of which are incorporated herein by reference.

TECHNICAL FIELD

The various embodiments described herein pertain generally to a method of supplying a temperature control fluid to a temperature control system and, also, relate to a storage medium. More particularly, the various embodiments described herein relate to a method of filling a temperature control fluid into pipes of a temperature control system which is applied to a semiconductor manufacturing apparatus, and, also, relate to a storage medium.

BACKGROUND ART

As a temperature control apparatus of controlling a temperature of an electrostatic chuck, there has been proposed an apparatus which has a heating cycle for heating a fluid and circulating the heated fluid through a temperature regulation member and a cooling cycle for cooling the fluid and circulating the cooled fluid into the temperature regulation member, and controls a flow rate division ratio among the heating cycle, the cooling cycle and a circulation path (see, for example, Patent Document 1). In this temperature control apparatus, the heating cycle and the cooling cycle have pipelines of completely closed and separate systems. A high-temperature fluid secondarily heated by the heat exchange with the high-temperature fluid circulating through the heating cycle and a low-temperature fluid secondarily cooled by the heat exchange with the low-temperature fluid circulating through the cooling cycle are mixed, and this mixed fluid flows into a pipe provided within the electrostatic chuck.
Patent Document 1: Japanese Patent Laid-open Publication No. 2010-117812

DISCLOSURE OF THE INVENTION

Problems to be Solved by the Invention

A temperature control ability of the aforementioned temperature control apparatus relies on how much fluid the apparatus can store constantly in heat storage tanks of the heating cycle and the cooling cycle, respectively. Accordingly, if the apparatus cannot maintain a state in which a certain amount of fluid is stored in each of the heat storage tanks of the heating cycle and cooling cycle at a preset temperature, temperature controllability may be degraded.

In this regard, the present inventor has proposed, in Japanese Patent Laid-open Publication No. 2013-105359, a temperature control system applicable to a semiconductor manufacturing apparatus such as a plasma etching apparatus. In this temperature control system, temperature control fluids (liquids) of different temperatures are supplied from a multiple number of temperature control units each of which is equipped with a heat storage tank and a pump. In this temperature control system, a temperature control fluid of a preset temperature, which is prepared by controlling flow rates of the supplied temperature control fluids, is supplied to a temperature control target object (for example, an electrostatic chuck). Thereafter, a part of this temperature control fluid is mixed with the temperature control fluids supplied from the temperature control units, and then, supplied to the temperature control target object again. For the purpose, a circulation pump of circulating the temperature control fluid is provided at a circulation path of circulating the temperature control fluid between the temperature control system and the temperature control target object.

Here, when operating the temperature control system for the first time after the temperature control unit and the temperature control system are provided in the semiconductor manufacturing apparatus, the pipe provided in the temperature control target object such as the electrostatic chuck, pipes within the temperature control system and various connecting pipes are not filled with the temperature control fluid. If the circulation pump is operated in this state, the circulation pump may be idled to be damaged. Therefore, the circulation pump needs to be driven after the temperature control fluid is sufficiently filled in these pipes.

In view of the foregoing, example embodiments provide a method of supplying a temperature control fluid into pipes of a temperature control system easily and securely while operating the temperature control system without any problem.

Means for Solving the Problems

In one example embodiment, a method of supplying a temperature control fluid to a temperature control system that includes a first fluid path into which a liquid regulated to have a first temperature is supplied as a first fluid and in which a first variable valve of controlling a flow rate of the first fluid is provided; a second fluid path into which a liquid regulated to have a second temperature different from the first temperature is supplied as a second fluid and in which a second variable valve of controlling a flow rate of the second fluid is provided; a joint path through which a mixed fluid of the first fluid and the second fluid is supplied to a temperature control target object; a collection path through which the fluid supplied to the temperature control target object is collected; a bypass path in which a third variable valve is provided and through which a part of the fluid flowing in the collection path is circulated into the temperature control target object; and a circulation pump provided in the collection path, and that controls a temperature of a component of a semiconductor manufacturing apparatus as the temperature control target object includes a first fluid supplying process of supplying the first fluid for a preset time period by respectively opening the first variable valve and the third variable valve at preset degrees of openness; a second fluid supplying process of supplying the second fluid for a preset time period by respectively opening the second variable valve and the third variable valve at preset degrees of openness; and a circulation pump driving process of driving the circulation pump in a state that the fluid flowing in the collection path is filled in the circulation pump, after the second fluid supplying process.

The method may further include a third fluid supplying process of supplying the first fluid into the first fluid path for a preset time period by opening only the first variable valve;

and a fourth fluid supplying process of supplying the second fluid into the second fluid path for a preset time period by opening only the second variable valve. Further, the third fluid supplying process and the fourth fluid supplying process may be performed after the circulation pump driving process.

The method may further include a fluid circulating process of circulating the fluid into the joint path, the collection path and the bypass path by opening only the third variable valve, after the fourth fluid supplying process.

The method may further include a temperature controlling process of controlling the temperature of the temperature control target object to a set temperature by adjusting a flow rate of the first fluid into the first fluid path, a flow rate of the second fluid into the second fluid path and a flow rate of the fluid into the bypass path by adjusting openness of the first variable valve, the second variable valve and the third variable valve. Further, the temperature controlling process may be performed after the fluid circulating process.

The temperature control system may further include a tank provided at an upstream side of the circulation pump in the collection path, and configured to store the fluid therein; and a liquid surface sensor configured to detect whether an amount of the fluid stored in the tank reaches a preset amount. Further, the circulation pump driving process may be performed in a state where the liquid surface sensor detects that the amount of the fluid stored in the tank reaches the preset amount.

The temperature control system may further include a tank provided at an upstream side of the circulation pump in the collection path, and configured to store the fluid therein; and a liquid surface sensor configured to detect whether an amount of the fluid stored in the tank reaches a preset amount. Further, the first fluid supplying process may be finished at a time point when the liquid surface sensor detects that the amount of the fluid stored in the tank has reached the preset amount.

The fluid may be sent from the tank to the circulation pump when the liquid surface sensor detects that the amount of the fluid stored in the tank has reached the preset amount.

In another example embodiment, a computer-readable storage medium has stored thereon computer-executable instructions that, in response to execution, cause a method of supplying a temperature control fluid to a temperature control system to be perform. The method of supplying the temperature control fluid to the temperature control system that includes a first fluid path into which a liquid regulated to have a first temperature is supplied as a first fluid and in which a first variable valve of controlling a flow rate of the first fluid is provided; a second fluid path into which a liquid regulated to have a second temperature different from the first temperature is supplied as a second fluid and in which a second variable valve of controlling a flow rate of the second fluid is provided; a joint path through which a mixed fluid of the first fluid and the second fluid is supplied to a temperature control target object; a collection path through which the fluid supplied to the temperature control target object is collected; a bypass path in which a third variable valve is provided and through which a part of the fluid flowing in the collection path is circulated into the temperature control target object; and a circulation pump provided in the collection path, and that controls a temperature of a component of a semiconductor manufacturing apparatus as the temperature control target object includes a first fluid supplying process of supplying the first fluid for a preset time period by respectively opening the first variable valve and the third variable valve at preset degrees of openness; a second fluid supplying process of supplying the second fluid for a preset time period by respectively opening the second variable valve and the third variable valve at preset degrees of openness; and a circulation pump driving process of driving the circulation pump in a state that the fluid flowing in the collection path is filled in the circulation pump, after the second fluid supplying process.

Effect of the Invention

In accordance with the example embodiments, it is possible to fill pipes of a temperature control system with a temperature control fluid simply and securely. Accordingly, since a circulation pump configured to circulate a fluid within the temperature control system is driven after the temperature-controlled fluid is sufficiently supplied to the circulation pump, damage of the circulation pump that may be caused by idling operation of the circulation pump can be prevented, so that the temperature control system can be operated normally.

DETAILED DESCRIPTION

In the following, example embodiments will be described, and reference is made to the accompanying drawings, which form a part of the description. Here, a method of supplying a temperature control fluid in accordance with an example embodiment is described to be applied to a system composed of a RIE plasma processing apparatus as an example semiconductor manufacturing apparatus and a temperature control system.

Figure 1:
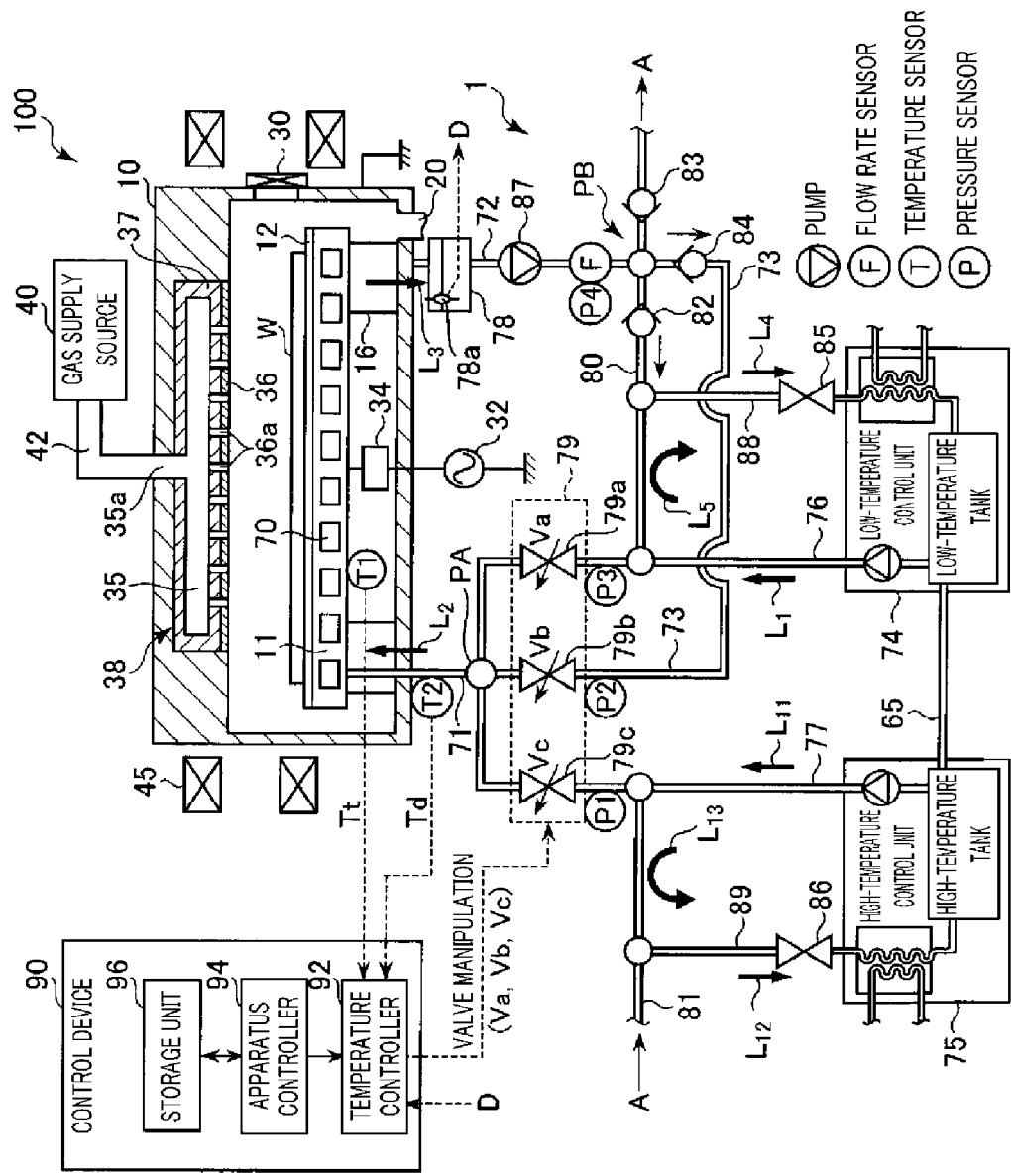
FIG. 1 is a diagram illustrating an overall configuration of a plasma processing apparatus and a temperature control system.

FIG. 1 is a diagram illustrating an overall configuration of a plasma processing apparatus 100 and a temperature control system 1.

The plasma processing apparatus 100 is configured as a RIE plasma processing apparatus and includes a cylindrical processing vessel 10 (chamber) made of a metal such as aluminum or stainless steel. The processing vessel 10 is grounded. A mounting table 11 configured to mount thereon a semiconductor wafer W (hereinafter, simply referred to as "wafer W") is provided within the processing vessel 10. The mounting table 11 is made of, but not limited to, aluminum and is supported on a cylindrical supporting member 16 which is extended vertically upward from a bottom of the processing vessel 10 with an insulating cylindrical holding member (not shown) therebetween.

An electrostatic chuck 12 configured to attract and hold the wafer W by an electrostatic force is provided on a top surface of the mounting table 11. The electrostatic chuck 12 attracts and holds the wafer W by a Coulomb force generated by a DC voltage applied thereto. In the present example embodiment, the electrostatic chuck 12 serves as a temperature control target object to be subjected to a temperature control by the temperature control system 1, and the temperature of the wafer W can be controlled by adjusting the temperature of the electrostatic chuck 12. Provided within the mounting table 11 is a temperature regulation member 70 which is a flow path through which a temperature control fluid supplied from the temperature control system 1 is circulated.

A gas exhaust path 20 is formed at a bottom wall of the processing vessel 10 to be located between a sidewall of the processing vessel and the cylindrical supporting member 16. The gas exhaust path 20 is connected with a gas exhaust device (not shown) such as a vacuum pump. A processing space within the processing vessel 10 is decompressed to a preset pressure (vacuum degree) by using the gas exhaust device. A loading/unloading opening for the wafer W is formed at the sidewall of the processing vessel 10, and the loading/unloading opening is opened or closed by a gate valve 30.

A high frequency power supply 32 for plasma generation is connected to the mounting table 11 via a matching device 34. The high frequency power supply 32 is configured to apply a high frequency power of, e.g., 60 MHz to the mounting table 11. In this way, the mounting table 11 also serves as a lower electrode. Further, a shower head 38 to be described below is provided at a ceiling portion of the processing vessel 10, and the shower head 38 serves as an upper electrode. Accordingly, a high frequency voltage applied from the high frequency power supply 32 is applied to a space between the mounting table 11 and the shower head 38 capacitively.

The shower head 38 provided at the ceiling portion of the processing vessel 10 includes an electrode plate 36 having a multiple number of gas through holes 36a; and an electrode supporting body 37 supporting the electrode plate 36 in a detachable manner. A buffer room 35 is formed within the electrode supporting body 37. A gas supply source 40 configured to supply a preset gas into the processing vessel 10 is connected to a gas inlet opening 35a of the buffer room 35 via a gas supply pipe 42.

A magnet 45 disposed in a ring shape or in a concentric shape is arranged around the processing vessel 10. Within the processing vessel 10, a high frequency electric field (RF electric field) is vertically formed in a plasma generation space between the shower head 38 and the mounting table 11 by the high frequency power supply 32. As a result, high-density plasma of a gas supplied from the shower head 38 is generated in the vicinity of the electrostatic chuck 12, and an etching process is performed on the wafer W, which is controlled to a preset temperature, by the generated plasma.

The temperature control system 1 is configured to receive temperature control fluids of different temperatures from two individual temperature control units, generate a temperature control fluid having a desired temperature by adjusting flow rates of the individual temperature control fluids of the different temperatures, and supply the generated temperature control fluid having the desired temperature to the temperature regulation member 70 within the mounting table 11. At this time, the temperature control system 1 is configured to circulate a part or the whole of the temperature control fluid having flown through the temperature regulation member 70 back into the temperature regulation member 70 and, also, circulate a part or the whole of the temperature control fluid having flown through the temperature regulation member 70 back into each of the temperature control units. Hereinafter, a detailed configuration of the temperature control system 1 will be elaborated.

Connected to the temperature control system 1 are a low-temperature control unit 74 configured to regulate a preset liquid used as a temperature control fluid to a first temperature (e.g., 10° C.) and supply the liquid of the first temperature to the temperature control system 1; and a high-temperature control unit 75 configured to regulate a preset liquid to a second temperature (e.g., 90° C.) and supply the liquid of the second temperature to the temperature control system 1. The same liquid is used as the temperature control fluid in the low-temperature control unit 74 and the high-temperature control unit 75. In the following description, appropriately, the temperature control fluid supplied from the low-temperature control unit 74 to the temperature control system 1 will be referred to as "low-temperature fluid", and the temperature control fluid supplied from the high-temperature control unit 75 to the temperature control system 1 will be referred to as "high-temperature fluid".

The low-temperature control unit 74 is configured to regulate the low-temperature fluid circulated therein and the fluid returned from the temperature control system 1 to the first temperature by a heat exchange unit, store the low-temperature fluid controlled to the first temperature in a low-temperature tank, and supply the low-temperature fluid stored in the low-temperature tank to the temperature control system 1 (as indicated by an arrow L1) through a pump. The temperature control fluid supplied from the temperature control system 1 into the temperature regulation member 70 provided within the mounting table 11 (as indicated by an arrow L2) is later returned back to the temperature control system 1 from the temperature regulation member 70 (as indicated by an arrow L3). A part of the fluid returned to the temperature control system 1 from the temperature regulation member 70 is then returned back into the low-temperature control unit 74 through a low-temperature circulation path 80 and a pipe 88 (indicated by an arrow L4).

A part of the low-temperature fluid supplied from the low-temperature control unit 74 to the temperature control system 1 through a low-temperature path 76 (as indicated by the arrow L1) flows into the pipe 88 (as indicated by an arrow L5), and then, is mixed with the fluid returned from the temperature control system 1. If the fluid returned from the temperature control system 1 is cooled to the first temperature just through the heat exchange by a heat exchanger, a load of the heat exchanger may be great because the temperature of the fluid returned from the temperature control system 1 is higher than the temperature of the low-temperature fluid. Thus, by mixing a certain amount of the low-temperature fluid with the fluid returned from the temperature control system 1, the load of the heat exchanger can be reduced. Further, the amount of the fluid returned back into the low-temperature control unit 74 can be adjusted by controlling a pipe pressure through the adjustment of the degree of openness of a valve 85 provided at the pipe 88.

Likewise, the high-temperature control unit 75 is configured to regulate the high-temperature fluid circulated within the high-temperature control unit 75 and the fluid returned from the temperature control system 1 to a second temperature by a heat exchange unit, store the high-temperature fluid regulated to the second temperature in a high-temperature tank, and supply the high-temperature fluid stored in the high-temperature tank to the temperature control system 1 (as indicated by an arrow L11) through a pump. A part of the temperature control fluid returned to the temperature control system 1 from the temperature regulation member 70 is returned back into the high-temperature control unit 75 through a high-temperature circulation path 81 and a pipe 89 (as indicated by an arrow L12).

A part of the high-temperature fluid L11 supplied from the high-temperature control unit 75 to the temperature control system 1 through a high-temperature path 77 (as indicated by the arrow L11) flows into the pipe 89 (as indicated by an arrow L12), and then, is mixed with the fluid returned from the temperature control system 1 (as indicated by an arrow L13). If the fluid returned from the temperature control system 1 is heated to the second first temperature just through the heat exchange, a load of a heat exchanger may be great because the temperature of the fluid returned from the temperature control system 1 is lower than the temperature of the high-temperature fluid. Thus, by mixing a certain amount of the high-temperature fluid with the fluid returned from the temperature control system 1, the load of the heat exchanger can be reduced. Further, the amount of the fluid returned back into the high-temperature control unit 75 can be adjusted by controlling a pipe pressure through the adjustment of the degree of openness of a valve 86 provided at the pipe 89.

Further, the low-temperature tank of the low-temperature control unit 74 and the high-temperature tank of the high-temperature control unit 75 are connected with each other by a liquid surface adjusting pipe 65 such that heights of liquid surfaces in the tanks are substantially same. Further, in order to achieve a required level of temperature control accuracy, a tank capable of mixing and storing a required amount of low-temperature fluid and a tank capable of mixing and storing a required amount of high-temperature fluid are used for the low-temperature control unit 74 and the high-temperature control unit 75, respectively.

The temperature control system 1 includes a valve unit 79 having variable valves 79a, 79b and 79c. The low-temperature path 76 is connected to the variable valve 79a, and the high-temperature path 77 is connected to the variable valve 79c. The temperature control system 1 also has a bypass path 73 configured to supply a part of the fluid returned to the temperature control system 1 from the temperature regulation member 70 back into the temperature regulation member 70. The bypass path 73 is connected to the variable valve 79b. Hereinafter, the fluid in the bypass path 73 will be referred to as "circulation fluid".

The low-temperature fluid, the circulation fluid and the high-temperature fluid sent to the temperature regulation member 70 through the variable valves 79a, 79b and 79c, respectively, reach a joint part PA provided at the downstream of the valve unit 79, and then, are introduced into the temperature regulation member 70 through a joint path 71 (as indicated by the arrow L2). Further, the valve unit 79 is disposed in the vicinity of the electrostatic chuck 12 serving as is a temperature control target object, and, thus, responsiveness in temperature control can be improved.

Figure 2A:
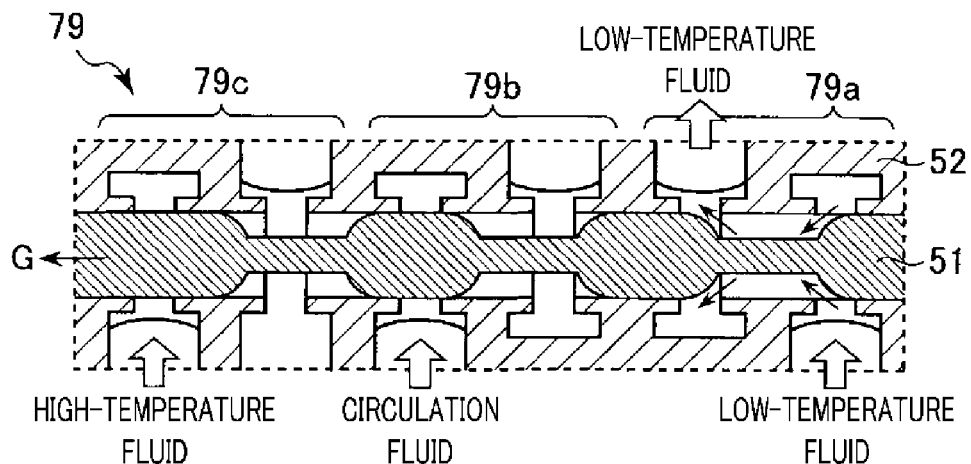
FIG. 2A to FIG. 2C are cross sectional views illustrating a schematic configuration of a valve unit provided in the temperature control system.
Figure 2B:
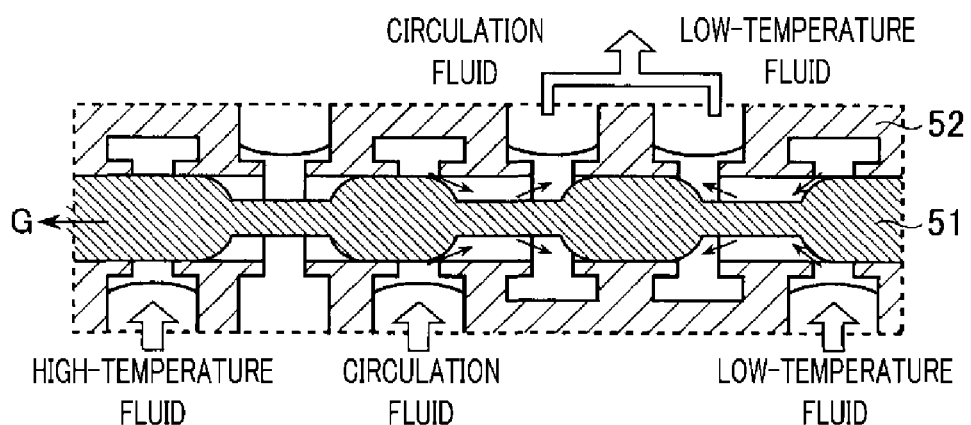
Figure 2C:
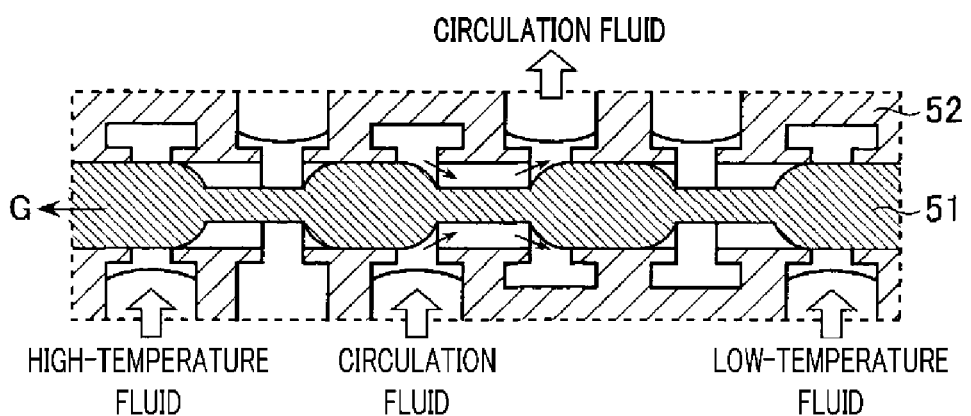

Here, a configuration of the valve unit 79 will be elaborated. FIG. 2A to FIG. 2C are cross sectional views illustrating a schematic configuration of the valve unit 79. Here, three different states are illustrated. That is, FIG. 2A depicts a state where the degree of openness Va of the variable valve 79a is 100%; FIG. 2B depicts a state where the degree of openness Va of the variable valve 79a is 50% and the degree of openness Vb of the variable valve 79b is 50%; and FIG. 2C depicts a state where the degree of openness Vb of the variable valve 79b is 100%.

Figure 3:
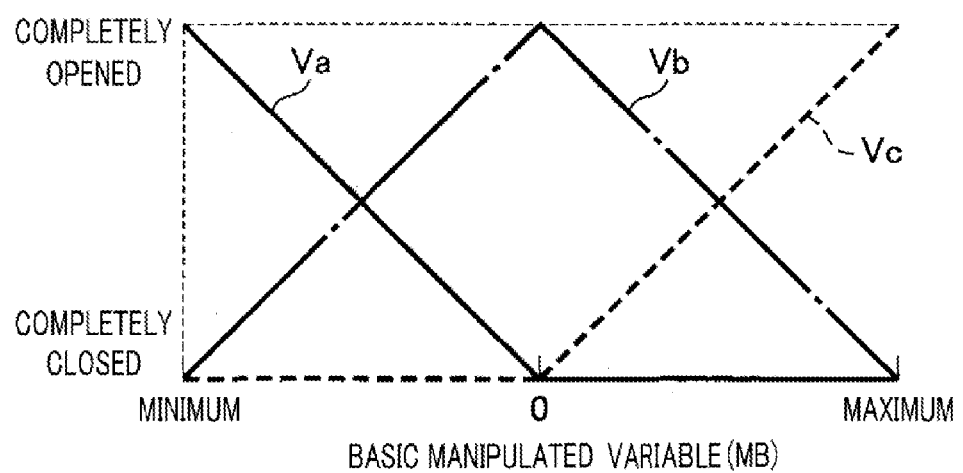
FIG. 3 is a diagram showing a relationship between the degrees of openness of three variable valves included in the valve unit.

FIG. 3 is a diagram illustrating a relationship between the openness Va, Vb and Vc of the variable valves 79a, 79b and 79c, respectively. A horizontal axis indicates the range of a basic manipulated variable MB of the valve unit 79 on a scale ranging from minimum to zero and to maximum, and a vertical axis represents valve openness ranging from "completely closed" to "completely opened".

The valve unit 79 has a cylinder 52 having separate inlet openings and outlet openings for the low-temperature fluid, the circulation fluid and the high-temperature fluid, respectively. A spool 51, in which thin portions and thick portions of different axis diameters are alternately arranged, is inserted into the cylinder 52, and the vicinity of each thin portion (i.e., a space between adjacent thick portions) serves as a fluid path.

The state of FIG. 2A where the openness Va of the variable valve 79a is "completely opened" whereas the openness Vb and Vc of the variable valves 79b and 79c are "completely closed" corresponds to a case where the basic manipulated variable MB is minimum in FIG. 3. In this state, since the inlet opening and the outlet opening for the low-temperature fluid are opened, the low-temperature fluid can pass through the valve unit 79. Meanwhile, since the inlet openings of the high-temperature fluid and the circulation fluid are closed by thick portions of the spool 51, the high-temperature fluid and the circulation fluid cannot be introduced into the fluid path.

From the state of FIG. 2A, if the spool 51 is slowly moved in a direction indicated by an arrow G, the inlet opening of the low-temperature fluid is gradually closed by a thick portion of the spool 51, whereas the thick portion once closing the inlet opening of the circulation path is retreated from the inlet opening of the circulation path. As a result, the inlet opening of the circulation path is gradually opened, as indicated in FIG. 2B. This state corresponds to a manipulation of changing the basic manipulated variable from the minimum toward zero.

That is, if the basic manipulated variable MB is increased from the minimum toward zero, the openness Va of the variable valve 79a decreases monotonously, whereas the openness Vb of the variable valve 79b increases monotonously. When the basic manipulated variable MB is larger than the minimum and smaller than zero, a mixture of the low-temperature fluid and the circulation fluid is supplied to the temperature regulation member 70. In the meanwhile, the openness Vc of the variable valve 79c is maintained at "completely closed". In the state of FIG. 2C where the basic manipulated variable MB is zero, the openness Va and Vc of the variable valves 79a and 79c are set to be "completely closed", whereas the openness Vb of the variable valve 79b is set to be "completely opened". Accordingly, only the circulation fluid can pass through the valve unit 79.

From the state of FIG. 2C, if the spool 51 is further moved slowly in the direction indicated by the arrow G, the thick portion of the spool 51 once closing the inlet opening of the high-temperature fluid is retreated from the inlet opening of the high-temperature fluid, thus so that the inlet opening of the high-temperature fluid is gradually opened, though not illustrated in the figure. At this time, since the outlet opening of the high-temperature fluid is already opened, the high-temperature fluid can pass through the valve unit 79. Concurrently, since the outlet opening of the circulation fluid is gradually closed by a thick portion of the spool 51, the circulation fluid cannot pass through the valve unit 79, although it can enter the valve unit 79. This state corresponds to a manipulation of changing the basic manipulated variable MB from zero toward the maximum.

That is, if the basic manipulated variable MB is increased from zero toward the maximum, the openness Vb of the variable valve 79b decreases monotonously, whereas the openness Vc of the variable valve 79c increases monotonously and the openness Va of the variable valve 79a is maintained at "completely closed". Accordingly, a mixture of the circulation fluid and the high-temperature fluid is supplied to the temperature regulation member 70. If the basic manipulated variable MB reaches the maximum, the openness Va and Vb of the variable valves 79a and 79b are set to be "completely closed", whereas the openness Vc of the variable valve 79c is set to be "completely opened". Accordingly, only the high-temperature fluid can pass through the valve unit 79.

As stated above, in the temperature control system 1, the low-temperature fluid and the high-temperature fluid are not supplied to the temperature regulation member 70 through the valve units 79 at the same time. As the basic manipulated variable MB increases from the minimum toward the maximum, the temperature of the fluid supplied to the temperature regulation member 70 is gradually altered from the low temperature to the high temperature.

The low-temperature path 76, the bypass path 73 and the high-temperature path 77 are equipped with pressure gauges P1, P2 and P3 in the vicinity of the variable valves 79c, 79b and 79a, respectively. Pressures (fluid pressures) in the pipes detected by the pressure gauges P1, P2 and P3 are used for a flow rate control by an apparatus controller 94 to be described later.

The temperature control system 1 includes a tank 78 which is configured to collect the fluid supplied to the temperature regulation member 70 through a collection path 72 and store a certain amount of the fluid therein. The tank 78 is equipped with a liquid surface sensor 78a as an example sensor configured to detect a storage amount of the fluid. The liquid surface sensor 78a is configured to output an OFF signal to the apparatus controller 94 when a fluid level in the tank 78 is lower than a preset height and output an ON signal when the fluid level in the tank 78 is equal to or higher than the preset height.

A circulation pump 87 configured to send out the fluid stored in the tank 78 to the downstream side (the bypass path 73, the low-temperature circulation path 80 and the high-temperature circulation path 81) is provided at the downstream of the tank 78. A flow rate sensor F and a pressure gauge P4 are provided at the downstream of the circulation pump 87. A fluid flow rate and a fluid pressure respectively detected by the flow rate sensor F and the pressure gauge P4, respectively, are used for the flow rate control by the apparatus controller 94.

In the temperature control system 1, the fluid flowing through the collection path 72 is divided into the bypass path 73, the low-temperature circulation path 80 and the high-temperature circulation path 81 at a branch part PB provided at the downstream of the flow rate sensor F. At this time, flow rates of the fluids flowing through the paths depend on a relationship of pressures applied to the respective paths. The bypass path 73, the low-temperature circulation path 80 and the high-temperature circulation path 81 are equipped with check valves 84, 82 and 83, respectively, for suppressing the fluid from flowing backward.

As stated above, the fluid sent into the low-temperature circulation path 80 from the branch part PB is returned back into the low-temperature control unit 74 through the pipe 88, and the fluid sent to the high-temperature circulation path 81 from the branch part PB is returned back into the high-temperature control unit 75 through the pipe 89. Further, the fluid (circulation fluid) sent into the bypass path 73 from the branch part PB is guided to the joint part PA through the variable valve 79b of the valve unit 79.

In the present example embodiment, the operations of the plasma processing apparatus 100 and the temperature control system 1 are controlled by a control device (computer) 90. Here, description of operation control of the plasma processing apparatus 100 will be omitted except for those regarding the temperature control of the electrostatic chuck 12.

The control device 90 includes a temperature controller 92, the apparatus controller 94 and a storage unit 96. The storage unit 96 stores various recipes (programs, parameters, etc.) for controlling operations of the plasma processing apparatus 100 and the temperature control system 1. The storage unit 96 also stores various kinds of information detected by the plasma processing apparatus 100 and the temperature control system 1 as data. The apparatus controller 94 controls the plasma processing apparatus 100 and the temperature control system 1 in an overall manner.

In order to control the temperature of the electrostatic chuck 12, the temperature controller 92 controls the flow rate and the temperature of the fluid supplied to the temperature regulation member 70 based on a detection temperature Tt of a temperature sensor T1 configured to detect a temperature of the electrostatic chuck 12 and a detection temperature Td of a temperature sensor T2 configured to detect a temperature of the fluid supplied to the temperature regulation member 70. At this time, the temperature controller 92 controls the openness Va, Vb and Vc of the variable valves 79a, 79b and 79c based on detection values of the pressure gauges P1 to P3 and, also, controls the driving of the circulation pump 87 (for example, a rotation speed of an inverter) based on a flow rate detected by the flow rate sensor F and a detection value from the pressure gauge P4 such that the flow rate of the fluid supplied to the temperature regulation member 70 is maintained constant.

Further, the temperature controller 92 controls ON/OFF operations of the circulation pump 87 based on a detection signal from the liquid surface sensor 78a. That is, if the circulation pump 87 is driven (idle-operated) when the fluid is not filled in the tank 78, the circulation pump 87 is highly likely to be broken. Therefore, the circulation pump 87 is controlled not to be driven when an OFF signal is outputted from the liquid surface sensor 78a.

Moreover, the functions of the temperature controller 92 and the apparatus controller 94 are implemented as a CPU (not shown) of the control device 90 develops and executes programs stored in the storage unit 96 in a working area of a RAM (not shown).

As stated above, in the temperature control system 1 in accordance with the present example embodiment, a fluid having a required temperature is prepared by using the low-temperature fluid, the high-temperature fluid and the circulation fluid without a heater and supplied to the temperature regulation member 70, so that the temperature of the electrostatic chuck 12 is controlled. Here, since preset amounts of fluid are supplied from the tanks provided in the low-temperature control unit 74 and the high-temperature control unit 75, respectively, the fluid can be supplied continuously without being exhausted, so that the temperature control can be stably performed at a high speed.

Immediately after assembling and connecting the temperature control system 1, the low-temperature control unit 74 and the high-temperature control unit 75 to the plasma processing apparatus 100 is completed, the pipes in the plasma processing apparatus 100 and the temperature control system 1 are not filled with the fluid, and the fluid is not stored in the tank 78, either. When the plasma processing apparatus 100 and the temperature control system 1 are powered on, if the circulation pump 87 is driven at a status where the fluid filled is not in the pipes, the circulation pump 87 may be broken as a result of the idling operation. Thus, the driving of the circulation pump 87 is restricted based on the detection signal from the liquid surface sensor 78a.

Therefore, in order to normally operate the temperature control system 1 after assembling the temperature control system 1 to the plasma processing apparatus 100, the fluid needs to be filled in the pipes within the plasma processing apparatus 100 and the temperature control system 1, first. Hereinafter, this fluid filling process (fluid filling sequence) will be described in detail.

Figure 4:
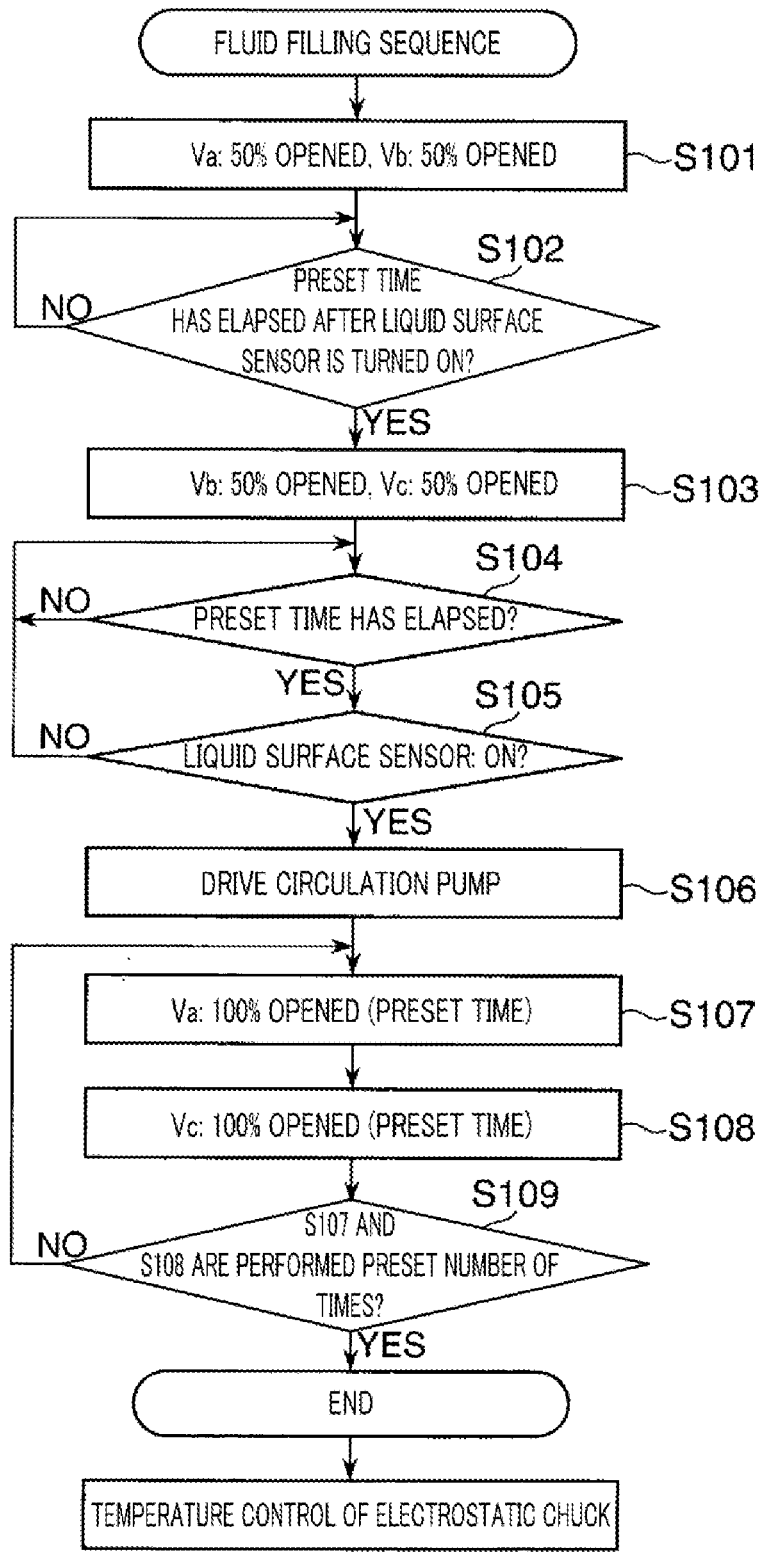
FIG. 4 is a flowchart for describing a process of filling a fluid into pipes of the plasma processing apparatus and the temperature control system in accordance with an example embodiment.

FIG. 4 is a flowchart for describing a process of filling the fluid in the pipes of the plasma processing apparatus 100 and the temperature control system 1. A series of processes depicted in FIG. 4 are implemented as the CPU of the control device 90 reads out programs for implementing the fluid filing sequence from the storage unit 96 and then develops and executes the programs in the working area of the RAM, thus controlling operations of individual components of the temperature control system.

Before the fluid filling sequence is executed, the plasma processing apparatus 100, the temperature control system 1, the low-temperature control unit 74 and the high-temperature control unit 75 are powered on by an operator. At this time, if the low-temperature control unit 74 and the high-temperature control unit 75 are not powered on, the temperature control system 1 may not be turned on. Alternatively, if the temperature control system 1 is powered on, it may be checked whether the low-temperature control unit 74 and the high-temperature control unit 75 are being driven. If the low-temperature control unit 74 and the high-temperature control unit 75 are not being operated, a warning signal may be outputted.

If the temperature control system 1 is powered on, the temperature controller 92 checks the detection signal of the liquid surface sensor 78a. Here, since an OFF signal is outputted from the liquid surface sensor 78a, the temperature controller 92 starts the fluid filling sequence of filling the fluid into the pipes (start fluid filling sequence). When the fluid filling sequence is started, since the low-temperature control unit 74 and the high-temperature control unit 75 are being operated, the low-temperature fluid is filled in the pipes indicated by the arrows L1→L5→L4 as depicted in FIG. 1, whereas the high-temperature fluid is filled in the pipes indicated by the arrows L11→L13→L12.

If the fluid filling sequence is started, the temperature controller 92 sets the openness Va and Vb of the variable valves 79a and 79b to 50%, respectively (process S101). Accordingly, the low-temperature fluid from the low-temperature control unit 74 flows in the order of the arrow L1→ the variable valve 79a→L2→L3→ the tank 78 shown in FIG. 1, so that these flow paths are filled with the low-temperature fluid.

Here, if a preset amount of fluid is stored in the tank 78, the liquid surface sensor 78a outputs an ON signal, and the fluid flows to the downstream side from the tank 78. In such a case, at a time point when the detection signal of the liquid surface sensor 78a is switched from the OFF signal to the ON signal, most of the low-temperature fluid does not flow to the downstream side of the tank 78. Thus, the low-temperature fluid to the temperature control system 1 is continuously supplied for a preset time (e.g., 30 seconds) after the detection signal of the liquid surface sensor 78a is switched to the ON signal.

Accordingly, the low-temperature fluid reaches the branch part PB through the circulation pump 87 which is not driven. A part of this low-temperature fluid flows into the bypass path 73, so that the flow path from the branch part PB to the joint part PA via the bypass path 73 and the variable valve 79b is filled with the low-temperature fluid. Further, a part of the low-temperature fluid that has reached the branch part PB is returned to the low-temperature control unit 74 through the low-temperature circulation path 80, so that the low-temperature circulation path 80 is also filled with the fluid.

Further, a driving force for filing the low-temperature fluid in the pipes at process S101 is applied by the pump provided in the low-temperature control unit 74. Further, at process S101, since the high-temperature control unit 75 is driven and, thus, the high-temperature fluid is being circulated in the high-temperature path 77 and the pipe 89, most of the low-temperature fluid that has reached the branch part PB does not flow into the high-temperature circulation path 81 due to a relationship with a pressure applied to the high-temperature circulation path 81.

Subsequently, the temperature controller 92 determines whether a preset time (e.g., 30 seconds) has elapsed after the detection signal from the surface liquid sensor 78a is switched to the ON signal (process S102) and waits until the preset time passes by (NO at process S102). If the preset time elapses (YES at process S102), the temperature controller 92 changes the openness Vb and Vc of the variable valves 79b and 79c, respectively, to 50% (process S103).

Through process S103, the high-temperature fluid from the high-temperature control unit 75 flows in the order of the arrow L11→the variable valve 79c→L2→L3→the tank 78 shown in FIG. 1. Since the low-temperature fluid is already stored in the tank 78, the high-temperature fluid is mixed with the low-temperature fluid within the tank 78, and flows downstream from the tank 78 to reach the branch part PB. Then, a part of this fluid flows into the bypass path 73, and a part of this fluid in the bypass path 73 is returned back into the high-temperature control unit 75 through the high-temperature circulation path 81. Further, a driving force for filling the fluid (the high-temperature fluid and the mixture of the low-temperature fluid and the high-temperature fluid mixed in the tank 78) in the pipes is applied by the pump incorporated in the high-temperature control unit 75.

Whether process S103 is completed or not is determined based on a processing time. That is, if process S103 is begun, the temperature controller 92 checks whether a preset processing time (e.g., 30 seconds) has elapsed (process S104) and waits until the preset processing time passes by (NO at process S104). If the processing time elapses (YES at process S104), the temperature controller 92 checks whether the liquid surface sensor 78a is on (process S105). If the liquid surface sensor 78a does not output the ON signal, the process returns back to process S104. Further, though not shown, if the detection signal from the liquid surface sensor 78a is not switched to the ON signal even after a certain time elapses after the determination result at process S105 is found to be "NO" for the first time, a warning signal may be set off to draw attention of the operator.

If the liquid surface sensor 78a is found to be ON (YES at process S105), the temperature controller 92 starts the driving of the circulation pump 87 (process S106). At this time, since the fluid is filled in the circulation pump 87 through the processes up to process S105 and a sufficient amount of the fluid is stored in the tank 78, the circulation pump 87 may not be broken due to the idling operation.

Thereafter, the temperature controller 92 sets the openness of the variable valve 79a to 100%, to flow the low-temperature fluid (process S107). Then, after the lapse of a preset time (e.g., 30 seconds), the temperature controller 92 sets the openness of the variable valve 79c to flow the high-temperature fluid as well (process S108). Then, after the lapse of a preset time (e.g., 30 seconds), the temperature controller 92 determines whether process S107 and process S108 are performed a preset number of times (e.g., twice) (process S109).

In case that processes S107 and S108 are not yet performed the preset number of times (NO at process S109), the process goes back to process S107. If the processes are performed the preset number of times (YES at process S109), the fluid filling sequence is finished. In this way, if the exhaust of air from the pipes and the filling of the fluid into the pipes in the temperature control system 1 are completed, the temperature controller 92 starts a test operation for checking whether the temperature control of the electrostatic chuck 12 is performed normally.

In the above-described fluid filling sequence, processes S107 and S108 are performed. If, however, allowing the fluid to be filled up to a level where the circulation pump 87 can be driven without a problem can be set at processes S101 and S103, the fluid filling sequence may be finished at process S104. Further, in the above-described fluid filling sequence, after the low-temperature fluid is supplied to the temperature control system 1, the high-temperature fluid is supplied. However, it may be also possible to supply the high-temperature fluid first, and then, the low-temperature fluid later.

Further, at processes S101, S103, S107 and S108 in the fluid filling sequence, the processing times are set to be 30 seconds. However, the example embodiment may not be limited thereto. For example, the processing times may be appropriately set depending on the capability of the pumps incorporated in the low-temperature control unit 74 and the high-temperature control unit 75, respectively. Further, though the repetition number of processes S107 and S108 is set to be twice, the repetition number may be set to be only once or more than twice as long as air can be exhausted from the pipes of the temperature control system 1 and the fluid can be filled in the pipes. Further, the valve openness at process S101 and S103 is not limited to 50%. For example, at processes S101 and S103, the openness of the variable valve 79b for controlling a flow rate of the circulation fluid may be set to be larger than the openness of the other valves in consideration of implementation of processes S107 and S108.

In the above-described fluid filling sequence, there is not performed a process of setting the openness of the variable valve 79b, through which the circulation fluid flows, to 100%. Through two processes S101 and S103, the fluid flows into the bypass path 73. Further, even if air remains in the flow path ranging from the branch part PB to the joint part PA via the bypass path 73, the remaining air may not completely stop the supply of the fluid into the circulation pump 87 from the tank 78 over a long period of time. Thus, the circulation pump 87 can be prevented from being broken. Meanwhile, it is possible to flow the fluid into the bypass path 73 with the openness of the variable valve 79b set to 100% during a time period from the end of process S109 until the beginning of the test operation. As a result, it is possible to accelerate the exhaust of the air from the path ranging from the branch part PB to the joint part PA via the bypass path 73 and filling of the fluid into this path.

In the above-described fluid filling sequence, if a preset amount of fluid is stored in the tank 78, the surface liquid sensor 78a outputs the ON signal, and the fluid flows to the downstream side of the tank 78. For this reason, at process S101, since the low-temperature fluid flows to the downstream side of the tank 78, a switching operation (process S103) of the valve unit 79 is performed after the lapse of a preset time after the detection signal from the liquid surface sensor 78a is turned on. However, it may be also possible to perform the switching operation (process S103) of the valve unit 79 immediately after the detection signal from the liquid surface sensor 78a is turned on, without awaiting the lapse of the preset time.

The reason for this is as follows. That is, a preset amount of low-temperature fluid is already stored in the tank 78 at the moment when the supply of the high-temperature fluid to the temperature control system 1 is begun. Accordingly, it is no sooner than the high-temperature fluid is introduced into the tank 78 that the mixture of the high-temperature fluid and the low-temperature fluid flows from the tank 78 to the downstream side thereof. As a result, the fluid is filled in the circulation pump 87, and the flow path ranging from the branch part PB to the joint part PA via the bypass path 73 and the variable valve 79b is filled with the fluid. Meanwhile, the low-temperature circulation path 80 is filled with the fluid through process S107. Even if air remains in the low-temperature circulation path 80, the air is sent to the low-temperature tank of the low-temperature control unit 74 and does not reach the circulation pump 87. Thus, breakdown of the circulation pump 87 can be prevented.

Further, the liquid surface sensor 78a may be turned on when the fluid is stored in a preset amount larger than a storage amount at which the fluid starts to be discharged from the tank 78. In this case, since a certain amount of fluid already flows toward the downstream side of the tank 78 at a time point when the detection signal from the liquid surface sensor 78a is switched to the ON signal, the switching operation (S103) of the valve unit 79 may be performed immediately after the liquid surface sensor 78a is turned on without awaiting the lapse of a preset time.

As stated above, according to the fluid filling sequence of filling the fluid into the temperature control system 1, the circulation pump 87 starts to be operated after the fluid is supplied to the circulation pump 87 sufficiently. Accordingly, the circulation pump 87 can be suppressed from being damaged (or broken) as a result of the idling operation.

Upon the completion of the above-described fluid filling sequence, the temperature controller 92 performs a temperature control test operation for checking whether the temperature control system 1 is normally operated. However, this temperature control test operation is not essential, and the temperature control of the electrostatic chuck 12 may be started according to a processing recipe for a wafer W immediately after the fluid filling sequence is completed.

In the temperature control test operation, the temperature controller 92 sets a target temperature of the electrostatic chuck 12 and feedback-controls the opening/closing of the variable valves 79a, 79b and 79c such that the temperature of the electrostatic chuck 12 reaches the target temperature while monitoring the temperature sensors T1 and T2 and the pressure sensors P1, P2 and P3. At this time, for example, in order to supply a certain amount of fluid to the temperature regulation member 70 regardless of the openness of the variable valves 79a, 79b and 79c, the openness of the valves 85 and 86 are adjusted to allow the pressure values of the pressure gauges P1 to P3 to be equal to each other, and, also, driving control of each of the pumps of the low-temperature control unit 74 and the high-temperature control unit 75 are performed (for example, rotation number control of the inverter).

To raise the temperature of the electrostatic chuck 12, the temperature controller 92 sets the openness Vc of the variable valve 79c of the high-temperature path 77 to be large, thus allowing mainly the high-temperature fluid to flow into the temperature regulation member 70. On the other hand, to lower the temperature of the electrostatic chuck 12, the temperature controller 92 sets the openness Va of the variable valve 79a of the low-temperature path 76 to be large, thus allowing mainly the low-temperature fluid to flow into the temperature regulation member 70. Further, the temperature of the fluid flowing in the joint path 71 is lowered. When a difference between a set temperature and an actual temperature of the electrostatic chuck 12 (i.e., a detection temperature of the temperature sensor T1) does not vary greatly, the temperature controller 92 reduces flow rates of the low-temperature fluid and the high-temperature fluid supplied from the tanks of the low-temperature control unit 74 and the high-temperature control unit 75, respectively, while flowing the fluid to the bypass path 73. Thus, the temperature of the electrostatic chuck 12 can be controlled with high energy efficiency.

If the temperature control system 1 runs normally, the temperature control for the electrostatic chuck 12 is started according to a processing recipe for the wafer W.

Here, the above-described example embodiment is not intended to be limiting and various changes and modifications can be made. By way of example, the method of supplying the temperature control fluid in accordance with the example embodiment can be used when the above-described temperature control system is applied to temperature control of various components of the semiconductor manufacturing apparatus such as, without limited to the electrostatic chuck, the upper electrode, the deposition shield, the processing vessel, and so forth. Further, the method of supplying the temperature control fluid in accordance with the example embodiment can be used when the above-described temperature control system is applied to a plasma processing apparatus configured to perform, without limited to the etching process, an ashing process, a sputtering process, or the like. Furthermore, the method of supplying the temperature control fluid in accordance with the example embodiment can be utilized when the above-described temperature control system is applied to, without limited to the parallel plate type etching process, a cylindrical RLSA (Radial Line Slot Antenna) semiconductor manufacturing apparatus, an ICP (Inductively Coupled Plasma) semiconductor manufacturing apparatus, a microwave semiconductor manufacturing apparatus, or the like.

The objects of the present disclosure can also be accomplished by installing a storage medium storing software programs in the computer (control device) and by reading out and executing the programs by the CPU of the computer. In such a case, the programs read out from the storage medium carry out the functions of the above-described example embodiment themselves, and the programs and the storage medium storing the programs constitute the present disclosure.

Further, the storage medium configured to store the programs may be implemented by, for example, a RAM, a NV-RAM, a floppy (registered trademark) disk, a hard disk, a magneto-optical disk, an optical disk such as a CD-ROM, a CD-R, a CD-RW, a DVD (a DVD-ROM, a DVD-RAM, a DVD-RW, a DVD+W, etc.), a magnetic tape, a nonvolatile memory card, other types of ROMs, etc., capable of storing the programs. Alternatively, the programs may be provided to the computer by being downloaded from another computer (not shown), database (not shown), or the like which is connected to Internet, a commercial network, a local area network, or the like.

Further, the present disclosure includes not only a case where the functions of the above-described example embodiments are implemented as the CPU of the computer executes the read-out programs, but also a case where an OS (operating system) driven on the CPU performs a part or all of actual processes based on instructions of the programs and the functions of the above-described example embodiments are implemented by those processes. Further, the present disclosure also includes a case where the programs read out from the storage medium is recorded in a memory provided in a function extension board inserted in the computer or a function expansion unit connected to the computer; a CPU provided in the function extension board or the function extension unit performs a part or all of the actual processes based on instruction of the programs; and the functions of the above-described example embodiments are implemented by those processes. The programs may be in the form of object codes, programs executed by an interpreter, script data provided to the OS, or the like.

This application claims priority to Japanese Patent Application No. 2012-161526, filed on Jul. 20, 2012 and U.S. Patent Provisional Application No. 61/677,034 provisionally filed on Jul. 30, 2012, which applications are hereby incorporated by reference in its entirety.

EXPLANATION OF CODES

1: Temperature control system
70: Temperature regulation member
71: Joint path
73: Bypass path
74: Low-temperature control unit
75: High-temperature control unit
79a, 79b, 79c: Variable valve
76: Low-temperature path
77: High-temperature path
78: Tank
90: Control device
92: Temperature controller
100: Plasma processing apparatus

I claim:

1. A method of supplying a temperature control fluid to a temperature control system that includes a first fluid path into which a liquid regulated to have a first temperature is supplied as a first fluid and in which a first variable valve of controlling a flow rate of the first fluid is provided; a second fluid path into which a liquid regulated to have a second temperature different from the first temperature is supplied as a second fluid and in which a second variable valve of controlling a flow rate of the second fluid is provided; a joint path through which a mixed fluid of the first fluid and the second fluid is supplied to a temperature control target object; a collection path through which the fluid supplied to the temperature control target object is collected; a bypass path in which a third variable valve is provided and through which a part of the fluid flowing in the collection path is circulated into the temperature control target object; and a circulation pump provided in the collection path, and that controls a temperature of a component of a semiconductor manufacturing apparatus as the temperature control target object, the method comprising:

a first fluid supplying process of supplying the first fluid for a preset time period by respectively opening the first variable valve and the third variable valve at preset degrees of openness;

a second fluid supplying process of supplying the second fluid for a preset time period by respectively opening the second variable valve and the third variable valve at preset degrees of openness; and a circulation pump driving process of driving the circulation pump in a state that the fluid flowing in the collection path is filled in the circulation pump, after the second fluid supplying process.

2. The method of claim 1, further comprising:

a third fluid supplying process of supplying the first fluid into the first fluid path for a preset time period by opening only the first variable valve; and a fourth fluid supplying process of supplying the second fluid into the second fluid path for a preset time period by opening only the second variable valve, wherein the third fluid supplying process and the fourth fluid supplying process are performed after the circulation pump driving process.

3. The method of claim 2, further comprising: a fluid circulating process of circulating the fluid into the joint path, the collection path and the bypass path by opening only the third variable valve, after the fourth fluid supplying process.

4. The method claim 3, further comprising: a temperature controlling process of controlling the temperature of the temperature control target object to a set temperature by adjusting a flow rate of the first fluid into the first fluid path, a flow rate of the second fluid into the second fluid path and a flow rate of the fluid into the bypass path by adjusting openness of the first variable valve, the second variable valve and the third variable valve, wherein the temperature controlling process is performed after the fluid circulating process.

5. The method of claim 1, wherein the temperature control system further comprises:

a tank provided at an upstream side of the circulation pump in the collection path, and configured to store the fluid therein; and a liquid surface sensor configured to detect whether an amount of the fluid stored in the tank reaches a preset amount, wherein the circulation pump driving process is performed in a state where the liquid surface sensor detects that the amount of the fluid stored in the tank reaches the preset amount.

6. The method of claim 1, wherein the temperature control system further comprises:

a tank provided at an upstream side of the circulation pump in the collection path, and configured to store the fluid therein; and a liquid surface sensor configured to detect whether an amount of the fluid stored in the tank reaches a preset amount, wherein the first fluid supplying process is finished at a time point when the liquid surface sensor detects that the amount of the fluid stored in the tank has reached the preset amount.

7. The method of claim 5, wherein the fluid is sent from the tank to the circulation pump when the liquid surface sensor detects that the amount of the fluid stored in the tank has reached the preset amount.

8. A computer-readable storage medium having stored thereon computer-executable instructions that, in response to execution, perform a method of supplying a temperature control fluid to a temperature control system that includes a first fluid path into which a liquid regulated to have a first temperature is supplied as a first fluid and in which a first variable valve of controlling a flow rate of the first fluid is provided; a second fluid path into which a liquid regulated to have a second temperature different from the first temperature is supplied as a second fluid and in which a second variable valve of controlling a flow rate of the second fluid is provided; a joint path through which a mixed fluid of the first fluid and the second fluid is supplied to a temperature control target object; a collection path through which the fluid supplied to the temperature control target object is collected; a bypass path in which a third variable valve is provided and through which a part of the fluid flowing in the collection path is circulated into the temperature control target object; and a circulation pump provided in the collection path, and that controls a temperature of a component of a semiconductor manufacturing apparatus as the temperature control target object, wherein the method comprises:

a first fluid supplying process of supplying the first fluid for a preset time period by respectively opening the first variable valve and the third variable valve at preset degrees of openness;

a second fluid supplying process of supplying the second fluid for a preset time period by respectively opening the second variable valve and the third variable valve at preset degrees of openness; and a circulation pump driving process of driving the circulation pump in a state that the fluid flowing in the collection path is filled in the circulation pump, after the second fluid supplying process.

* * * * *